US010741732B2

(12) United States Patent
Yuasa

(10) Patent No.: US 10,741,732 B2
(45) Date of Patent: Aug. 11, 2020

(54) LIGHT EMITTING DEVICE AND LIGHT SOURCE

(71) Applicant: NICHIA CORPORATION, Anan-shi (JP)

(72) Inventor: Taiki Yuasa, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 16/261,564

(22) Filed: Jan. 30, 2019

(65) Prior Publication Data

US 2019/0237635 A1 Aug. 1, 2019

(30) Foreign Application Priority Data

Jan. 31, 2018 (JP) .................................. 2018-014218

(51) Int. Cl.
*H01L 29/20* (2006.01)
*H01L 33/00* (2010.01)
(Continued)

(52) U.S. Cl.
CPC ........ *H01L 33/504* (2013.01); *C09K 11/0883* (2013.01); *C09K 11/7728* (2013.01);
(Continued)

(58) Field of Classification Search
USPC ................ 257/81, 82, 91, 98–100, 116, 117, 257/432–437, 749, E33.056–E33.059,
(Continued)

(56) References Cited

U.S. PATENT DOCUMENTS 4,843,573 A * 6/1989 Taylor ..................... G09G 5/02
345/591
8,896,197 B2 * 11/2014 Negley .................. H05B 45/20
313/501
(Continued)

FOREIGN PATENT DOCUMENTS

JP 2004-311822 11/2004
JP 2005-093912 4/2005
(Continued)

*Primary Examiner* — Niki H Nguyen
(74) *Attorney, Agent, or Firm* — Mori & Ward, LLP

(57) ABSTRACT

A light emitting device includes at least one first light emitting element to emit a first light and at least one fluorescent material to convert the first light to a second light. The second light has chromaticity existing in an enclosed area in a CIE 1931 chromaticity diagram. The CIE 1931 chromaticity diagram has a curved boundary indicating a spectral locus. The enclosed area is enclosed with a first straight line, a second straight line, a third straight line, and a curved line. The first straight line connects a first point at which x is equal to 0.666 and y is equal to 0.334 and a second point at which x is equal to 0.643 and y is equal to 0.334. The second straight line connects the second point and a third point at which x is equal to 0.576 and y is equal to 0.291. The third straight line connects the third point and a fourth point at which x is equal to 0.737 and y is equal to 0.263. The curved line connects the fourth point and the first point. The curved line is a part of the curved boundary.

14 Claims, 5 Drawing Sheets

(51) Int. Cl.
*H01L 33/50* (2010.01)
*H01L 33/60* (2010.01)
*C09K 11/08* (2006.01)
*H01L 33/32* (2010.01)
*H01L 27/15* (2006.01)
*C09K 11/77* (2006.01)
*H01L 33/56* (2010.01)

(52) U.S. Cl.
CPC .............. *H01L 27/15* (2013.01); *H01L 33/32* (2013.01); *H01L 33/507* (2013.01); *H01L 33/56* (2013.01); *H01L 33/60* (2013.01)

(58) Field of Classification Search
USPC ................ 257/E25.032; 438/25–28; 313/502
See application file for complete search history.

(56) References Cited

U.S. PATENT DOCUMENTS

| | | | |
|---|---|---|---|
| 2006/0226759 A1 | 10/2006 | Masuda et al. | |
| 2007/0205711 A1* | 9/2007 | Takashima | H01L 33/44 313/502 |
| 2008/0199728 A1 | 8/2008 | Kim et al. | |
| 2014/0361328 A1 | 12/2014 | Shimamura et al. | |
| 2015/0188004 A1 | 7/2015 | Ozeki et al. | |
| 2016/0126428 A1 | 5/2016 | Hosokawa et al. | |
| 2018/0006197 A1 | 1/2018 | Yuasa et al. | |
| 2018/0123000 A1 | 5/2018 | Suzuki et al. | |

FOREIGN PATENT DOCUMENTS

| | | |
|---|---|---|
| JP | 2005-093913 | 4/2005 |
| JP | 2006-232948 | 9/2006 |
| JP | 2007-049114 | 2/2007 |
| JP | 2007-088248 | 4/2007 |
| JP | 2008-202044 | 9/2008 |
| JP | 2009-076656 | 4/2009 |
| JP | 2009-280763 | 12/2009 |
| JP | 2010-157666 | 7/2010 |
| JP | 2010-192614 | 9/2010 |
| JP | 2011-204406 | 10/2011 |
| JP | 2013-065726 | 4/2013 |
| JP | 2013-231149 | 11/2013 |
| JP | 2014-143344 | 8/2014 |
| JP | 2014-222705 | 11/2014 |
| JP | 2015-008329 | 1/2015 |
| JP | 2015-128085 | 7/2015 |
| JP | 2016-092401 | 5/2016 |
| JP | 2018-006471 | 1/2018 |
| JP | 2018-078285 | 5/2018 |

* cited by examiner

LIGHT EMITTING DEVICE AND LIGHT SOURCE

CROSS-REFERENCE TO RELATED PATENT APPLICATION

The present application claims priority under 35 U. S. C. § 119 to Japanese Patent Application No. 2018-014218, filed Jan. 31, 2018. The contents of this application are incorporated herein by reference in their entirety.

BACKGROUND OF THE INVENTION

Field of the Invention

The present disclosure relates to a light emitting device and a light source.

Discussion of the Background

Light emitting devices containing light emitting diodes (LEDs) have been used in a wide range of applications such as for displays, warning lamps, indicators, luminaries, and so forth. Examples of such light emitting devices include diode lamps configured to emit a color light and include a blue light emitting diode element to emit blue light and a yellow fluorescent material to emit yellow light upon being excited by the blue light. One example thereof is a diode lamp described in Japanese Unexamined Patent Application Publication No. 2007-088248. Also, there have been known lighting configurations for vehicle tale lamps and/or brake lamps, in which, a blue light emitting diode and a fluorescent material configured to convert light from the blue light emitting diode to red light are used. One example thereof is described in Japanese Unexamined Patent Application Publication No. 2011-204406.

SUMMARY OF THE INVENTION

According to one aspect of the present invention, a light emitting device includes at least one first light emitting element to emit a first light having a first peak emission wavelength in a range of 370 nm or greater and 420 nm or less, and at least one fluorescent material to convert the first light to a second light having a second peak wavelength in a range of 550 nm or greater and to 780 nm or less. The second light has chromaticity existing in an enclosed area in a CIE 1931 chromaticity diagram in which chromaticity is defined in x and y coordinates. The CIE 1931 chromaticity diagram has an outer curved boundary indicating a spectral locus. The enclosed area is enclosed with a first straight line, a second straight line, a third straight line, and a curved line. The first straight line connects a first point at which x is equal to 0.666 and y is equal to 0.334 and a second point at which x is equal to 0.643 and y is equal to 0.334. The second straight line connects the second point and a third point at which x is equal to 0.576 and y is equal to 0.291. The third straight line connects the third point and a fourth point at which x is equal to 0.737 and y is equal to 0.263. The curved line connects the fourth point and the first point. The curved line is a part of the curved boundary.

According to another aspect of the present invention, a light source includes the light emitting device, a first additional light emitting device having a second light emitting element made of a nitride-based semiconductor to emit green light, and a second additional light emitting device having a third light emitting element made of a nitride-based semiconductor to emit blue light.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

Figure 1:
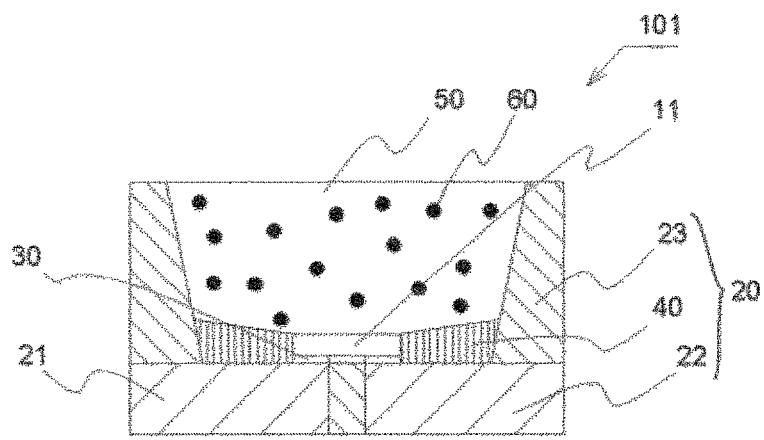
FIG. 1 is a schematic cross-sectional view showing an example of light emitting device according to a first embodiment.

The embodiments will now be described with reference to the accompanying drawings, wherein like reference numerals designate corresponding or identical elements throughout the various drawings.

A first light emitting device (a light emitting device) according to a first embodiment will be described by way of the Embodiments and Examples. However, the present invention is not to be limited only to these embodiments and examples. The embodiments illustrated below are intended as illustrative of a first light emitting device to give concrete forms to technical ideas of the present invention, and the scope of the invention is not limited to the first light emitting device to those described below.

The relation between the color names and the chromaticity coordinates, the relation between the range of wavelength of light and the color name of single color light, and the like conform to Japanese Industrial Standard (JIS) Z8110. More specifically, the wavelengths of 380 nm to 410 nm correspond to purple light, 410 nm to 455 nm correspond to blue purple light, 455 nm to 485 nm correspond to blue light, 485 nm to 495 nm correspond to blue green light, 495 nm to 548 nm correspond to green light, 548 nm to 573 nm correspond to yellow green light, 573 nm to 584 nm correspond to yellow light, 584 nm to 610 nm correspond to yellow red light, and 610 nm to 780 nm correspond to red light.

Also, a numerical range indicated using "to" in the present specification represents a range including numerical values described before and after "to" as a minimum value and a maximum value, respectively. Further, when a plurality of substances that correspond to one component are present in a composition, the term "(a) content of a component in the composition" is referred to a total amount of the plurality of substances present in the composition, unless otherwise indicated.

First Light Emitting Device

Figure 2:
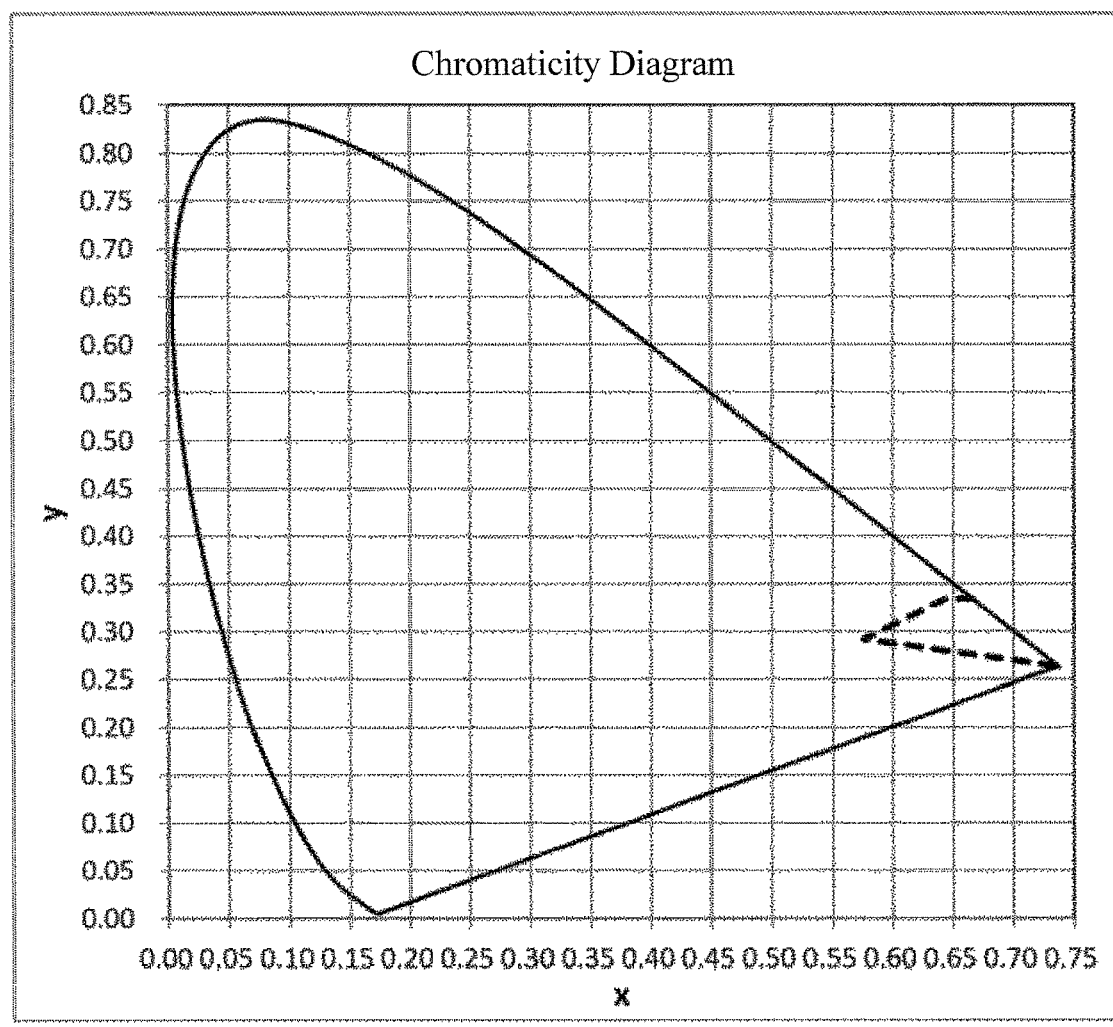
FIG. 2 is a CIE 1931 chromaticity diagram showing a range of chromaticity coordinates of light emitted by a light emitting device according to the first embodiment.

A first light emitting device will be illustrated below with reference to accompanying drawings. FIG. 1 is a schematic cross-sectional view showing an example of light emitting device according to the first embodiment. FIG. 2 is a CIE 1931 chromaticity diagram showing a range of chromaticity coordinates of light emitted by a light emitting device according to the first embodiment.

The first light emitting device 101 is configured to emit short-wavelength visible light, for example, light having a wavelength in a range of 360 nm to 450 nm, and includes a first light emitting element 11 of a gallium nitride-based compound semiconductor having a first peak emission wavelength in a range of 370 nm to 420 nm, and a package 20 where the light emitting element 11 is mounted. The package 20 includes a first lead 21, a second lead 22, and a fixing part 23. The package 20 is provided with a recess defined by an upward-facing surface and at least one lateral surface. The first lead 21 and the second lead 22 are arranged to form parts of the upward-facing surface and the fixing part 23 that is electrically insulating is arranged to insulate the first lead 21 and the second lead 22. The fixing part 23 is preferably disposed between the first lead 21 and the second lead 22 and integrally formed into the at least one lateral surface, but the fixing part 23 may disposed between the first lead 21 and the second lead 23 and the at least one lateral surface defining the recess may be formed with another member. The first light emitting element 11 is mounted on the upward-facing surface of the recess of the package 20. The first light emitting element 11 has positive and negative electrodes at a same surface side, and is mounted in a face-down manner. The first light emitting element 11 is electrically connected to the first lead 21 and the second lead 22 by the electrically conductive member 30, respectively. The first light emitting element 11 is covered by the sealing member 50 that contains a fluorescent material 60.

Instead of face-down mounting, the first light emitting element 11 may be mounted in a face-up manner. When a face-up mounting is employed, the first light emitting element 11 may be electrically connected to the first lead 21 and the second lead 22 by using wires in place of the electrically conductive member 30.

The first light emitting device 101 includes a light source that mainly includes the first light emitting element 11 having a first peak emission wavelength in a range of 370 nm to 420 nm, and at least one fluorescent material 60 having a second peak emission wavelength in a range of 550 nm to 780 nm. In the specification, the expression "mainly includes" refers to inclusion of fluorescent material that contributes to light emission.

The first light emitting device 101 is configured to emit light in a range corresponding to an enclosed area in the CIE 1931 chromaticity diagram, obtained by determining a first point at chromaticity coordinates of x=0.666, y=0.334, a second point at chromaticity coordinates of x=0.643, y=0.334, a third point at chromaticity coordinates of x=0.576, y=0.291, and a fourth point at chromaticity coordinates of x=0.737, y=0.263, then assuming a first straight line between the first point and a second point, a second straight line between the second point and the third point, and a third straight line between the third point and the fourth point, and, enclosing an area with the first, second, and third straight lines and a curved line between the fourth point and the first point in the chromaticity diagram. The CIE 1931 is incorporated by reference. The CIE 1931 chromaticity diagram has a curved boundary indicating a spectral locus. The curved line is a part of the curved boundary. With this configuration, the first light emitting device 101 that can emit light of predetermined red color with high luminance can be provided.

The first light emitting element 11 has a first peak emission wavelength in a range of 370 nm to 420 nm, preferably in a range of 400 nm to 415 nm. The use of light at a shorter wavelength side of visible light can reduce influence of the light on the luminance. The luminous efficiency factor is to express a degree of sensitivity of human visual perception with respect to wavelength. The human eye is sensible to light of wavelength in a range of about 400 nm to 700 nm. In high light conditions (i.e., in day light or other bright light), the human eye is most sensitive to light of 555 nm in green region. For example, in high light conditions, when the intensity of green light of wavelength 555 nm perceived by the human eye is assumed to be 100, the same of blue light of 450 nm is about 3.8 and red light of 700 nm is about 0.4. Thus, even when a predetermined amount of visible light in a range of 400 nm to 415 nm has been emitted, the human eye perceive it with little intensity, such that the human eye perceive red light that is emitted from the fluorescent material 60 is emitted from the first light emitting device. Meanwhile, the first light-emitting element 11 can excite the fluorescent material 60 to emit a predetermined amount of light. Accordingly, a light emitting device of high luminance can be provided.

The first light emitting element 11 has an appropriate half value width of the emission spectrum, which is preferably 30 nm or less. With the half band width of 30 nm or less, light of short wavelength side can be made to be hardly visibly recognized.

In the emission spectrum of the first light emitting device 101, when the maximum intensity of the second peak emission wavelength is assumed to be 1, the relative intensity of the first peak emission wavelength to be preferably in a range of 0.005 to 0.2, more preferably in a range of 0.02 to 0.15. With a predetermined ratio of light having the first peak emission wavelength and light having the second peak emission wavelength, the first light emitting device 101 that can emit red light of high luminance can be provided. The first light emitting device 101 that can emit red light is realized by increasing the amount of light that is emitted from the first light emitting element 11 and is absorbed by the fluorescent material 60, and significantly reducing the amount of light that is emitted from the first light emitting element 11 and is discharged to the outside from the first light emitting device 101. If discharging of light from the first light emitting element 11 to the outside is totally blocked, the amount of light discharged from the first light emitting device 101 to the outside decreases, and the first light emitting device 101 of high luminance cannot be obtained. Accordingly, when the maximum intensity at the second peak emission wavelength is set to 1, the relative intensity at the first peak emission wavelength is preferably in a range of 0.005 to 0.2, particularly preferably in a range of 0.02 to 0.15.

The at least one fluorescent material 60 is at least one selected from the group consisting of a $(Sr,Ca)AlSiN_3:Eu$ fluorescent material, a CaAlSiN$_3$:Eu fluorescent material, and a K$_2$SiF$_6$:Mn fluorescent material. Accordingly, the first light emitting device with high luminance can be provided.

The at least one fluorescent material 60 is preferably a combination of a (Sr, Ca)AlSiN$_3$:Eu fluorescent material and a CaAlSiN$_3$:Eu fluorescent material. With this combination, absorption of light between the (Sr,Ca)AlSiN$_3$:Eu fluorescent material and the CaAlSiN$_3$:Eu fluorescent material can be reduced, and the first light emitting device of predetermined brightness can be provided. That is, the peak emission wavelength of the (Sr,Ca)AlSiN$_3$:Eu fluorescent material is 10 nm or more longer than the peak emission wavelength of the CaAlSiN$_3$:Eu fluorescent material, so that the first light emitting device 101 that can emit deeper red light can be provided.

It is preferable that the first light emitting device 101 further includes a light-reflecting member 40 covering lateral surfaces of the first light emitting element 11 and a sealing member 50 covering the upper surface of the first light emitting device 11 and containing the fluorescent material 60. With this arrangement, a large amount of light emitted from the lateral surfaces of the first light emitting element 11 can be directed in a front direction. Also, covering the upper surface of the first light emitting element 11 and the upper surface of the reflecting member 40 by the fluorescent material 60 can reduce the amount of returning light that is emitted from the first light emitting element 11 and incident on and reflected from the fluorescent material 60 and other component members toward the first light emitting element 11. That is, the amount of light emitted from the first light emitting element 101 to the outside can be reduced when the returning light incident on the lateral surfaces of the first light emitting element 11 and propagates within the first light emitting element 11.

The sealing member 50 is preferably arranged in order from the side proximate to the first light emitting element 11, a layer containing the CaAlSiN$_3$:Eu fluorescent material, and a layer containing the (Sr, Ca)AlSiN$_3$:Eu fluorescent material. With this arrangement, the amount of light emitted from the (Sr, Ca)AlSiN$_3$:Eu fluorescent material and absorbed by the CaAlSiN$_3$:Eu fluorescent material can be reduced, thus, the first light emitting device 101 of higher efficiency can be provided.

It is preferable that the sealing member 50 includes, from the side proximate to the side distal to the first light emitting element 11, the first layer containing a fluorescent material and the second layer containing a fluorescent material, with an interface between the first layer and the second layer. When the content amount of the fluorescent material contained in the first layer is assumed to be 100%, the content of the fluorescent material contained in the second layer is to be in a range of 1% to 60%. Providing the interface between the first layer and the second layer can reduce the amount of light returning to the first layer from the second layer. Also, containing a lower content of the fluorescent material in the second layer than that in the first layer allows for an increase in the amount of light emitted from the first light emitting element 11 and the fluorescent material contained in the first layer.

The content of the fluorescent material 60 is preferably in a range of 20 parts to 50 parts by weight with respect 100 parts by weight of the sealing member 50. If the fluorescent material 60 is used to increase the amount of red light, the amount of light emitted from the first light emitting device 101 to the outside decreases. Thus, the content amount of the fluorescent material 60 is preferably in the predetermined range.

The first light emitting element 11 is preferably a nitride-based semiconductor, because of its good heat resistance and good optical resistance.

Figure 3:
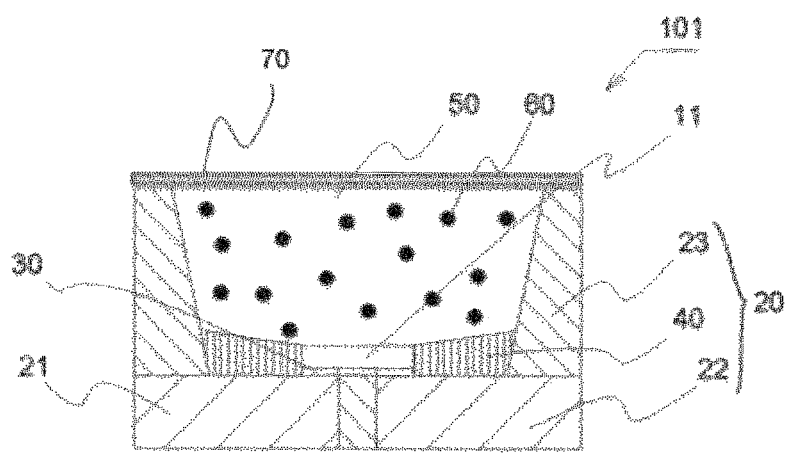
FIG. 3 is a schematic cross-sectional view showing an example of light emitting device according to the first embodiment.

FIG. 3 is a schematic cross-sectional view showing an example of light emitting device according to the first embodiment.

As shown in FIG. 3, it is preferable that the first light emitting device 101 further includes a dielectric multilayer film 70 on the sealing member 50. The light of the first light emitting element 11 that is emitted from the first light emitting device 101 to the outside can be returned toward the fluorescent material side by the dielectric multilayer film 70. Thus, the first light emitting device 101 that can efficiently emit predetermined red light can be provided. For example, dispersing the fluorescent material allows for a reduction in the amount of light that is blocked by the fluorescent material contained in the upper layer, which allows for an increase in the amount of light emitted from the fluorescent material and discharged to the outside from the first light emitting device. On the other hand, this arrangement can facilitate the propagation of light from the first light emitting element among the fluorescent material, which may result in an increase in the amount of light leaking from the first light emitting device to the outside. However, the light leaking to the outside can be reflected 70 by the dielectric multilayer film and made incident on the fluorescent material. Thus, the amount of light emitted from the first light emitting element and discharged from the first light emitting device to the outside can be reduced.

The dielectric multilayer film 70 is preferably disposed on an upper surface of the sealing member 50. Also, in addition to the upper surface of the sealing member 50, the dielectric multilayer film 70 is preferably disposed on the upper surface of the package 20 defining a recess. Accordingly, all or most light from the first light emitting element can be reflected at the dielectric multilayer film 70 and leakage of light emitted from the first light emitting element to the outside of the first light emitting device can be reduced. With the dielectric multilayer film 70 provided to the first light emitting device, red light of high purity can be realized.

The dielectric multilayer film 70 is configured to reflect light of the first light emitting element and transmit light having second peak emission wavelength. The dielectric multilayer film 70 preferably has a reflection spectrum that provides a reflectance of 40% or greater, more preferably 45% or greater, to light from the first light emitting element in a wavelength range of 370 nm to 420 nm, incident to the dielectric multilayer film 70 at an incident angle range of 0° to 85°. It is further preferable that the dielectric multilayer film 70 has a reflection spectrum with a reflectance of 90% or greater, to light from the first light emitting element in a wavelength range of 370 nm to 420 nm, incident to the dielectric multilayer film 70 at an incident angle range of 0° to 50°.

With this arrangement, even when the light from the first light emitting element 11 is incident to the dielectric multilayer film 70 at an incident angle other than normal (i.e., 0°), transmittance of light from the first light emitting element 11 can be prevented or reduced, which allows for providing a first light emitting device 101 whose emission of near-ultraviolet light, violet light, or blue-violet light that is harmful to human health can be prevented or reduced.

The first light emitting device 101 can exhibit each chromaticity coordinates at the points as described above, with a difference in the range of chromaticity coordinates at an ambient temperature of 25° C., and the range of chromaticity coordinates at an ambient temperature of 150° C., within a range of x=0.010, and y=0.010. As described above, the first light emitting device 101 that exhibits small change in the chromaticity in spite of a change in the ambient temperature. In the applications requiring a certain range of chromaticity, such as warning lights and indicator lights, occurrence of large shifts in color is undesirable. Therefore, the first light emitting device 101 that can provide small maximum allowable shifts in chromaticity can be significantly useful.

Examples of the type of the light emitting device 101 include a lamp-type and a surface-mounted type, and a chip type. Generally, the term (a) "lamp-type" refers that a resin material forming the external surface of a light emitting device is formed in a lamp-shape. For example, a lamp-type light emitting device includes a lead member having a cup-shape at one side, a light emitting element arranged in the cup, and a sealing resin member covering the light emitting element and a portion of the lead member. Meanwhile, a "surface-mounted type" light emitting device refers to that a light emitting element is placed in a recess-shaped housing and resin is applied in the recess to cover the light emitting element. The recess-shaped housing may be formed by using a material such as thermoplastic resin, thermosetting resin, ceramics, or a metal. A "chip type" light emitting device refers to that without providing a recess-shaped housing, a fluorescent material is applied on a light emitting element, and lateral surfaces of the light emitting element, or the like is secured in place by a resin material. For a chip type light emitting device, a layer containing a fluorescent material can be applied in a plate-like shape, or may be applied in a lens shape. In the description below, a surface-mounted type will be illustrated.

Light Emitting Element

The light emitting element has a peak emission wavelength in a range of 370 nm to 420 nm. The use of a light emitting element that has an emission peak wavelength in the range shown above as an excitation light source allows for obtaining of a light emitting device to emit light of mixed color of the light emitted from the light emitting element and fluorescent light emitted from the phosphors.

For the first light emitting element, a semiconductor light emitting element can be preferably used. Because a semiconductor light emitting element can provide high linearity of outputting to inputting in high efficiency, and has high tolerance to mechanical impacts and stability. For example, a semiconductor light emitting element configured to emit light of a blue-purple color or a blue color, using a nitride-based semiconductor ($In_XAl_YGa_{1-X-Y}N$, $0 \leq X$, $0 \leq Y$, $X+Y \leq 1$) etc., can be used.

Package

A surface-mounted type package has a first lead, a second lead, and a fixing part. For a surface-mounted type package, a top-view type that is used to emit light in a direction approximately perpendicular to the mounting surface, or a side-view type that is used to emit light in a direction approximately in parallel to the mounting surface, is mainly employed, and either type can be employed in the present disclosure.

The first lead and the second lead are each made of a plate-shaped metal. When viewed from the opening of the recess, the first lead and the second lead are not projected outside of the fixing part, but a configuration in which the first lead and/or the second lead projecting outside of the fixing part can also be employed.

Examples of preferable materials for the first lead and the second lead include, a metal having a thermal conductivity of about 200 W/(m·K) or greater, a material having relatively large mechanical strength, and a material which can be easily processed in pressing or etching More specific examples of such materials include metals such as copper, aluminum, gold, silver, tungsten, iron, nickel, and alloys such as iron-nickel alloy and phosphor bronze. Also, a base material that is covered by a metal such as silver, aluminum, or gold, having higher optical reflectance than the base material may also be employed. For the fixing part, resin such as thermoplastic resin or thermosetting resin, inorganic material such as ceramics, a metal that is covered by an insulating material, or the like, can be employed. Also, it is preferable that a light-reflecting material is contained in the material of the fixing part, for example, in the resin or the like.

Electrically Conductive Member

The electrically conductive member is configured to secure the first light emitting element to the package, and to electrically connect the positive and negative electrodes of the first light emitting element to the first lead and the second lead, respectively. For the electrically conducting bonding member, an appropriate material can be selected according to a purpose, examples thereof include electrically conductive paste of silver, gold, palladium, or the like, and solder such as tin-bismuth-based solder, tin-copper-based solder, tin-silver-based solder, gold-tin-based solder, or the like, a brazing material such as a low-melting-point metal.

Reflecting Member

The reflecting member covers one or more lateral surfaces of the first light emitting element and upper surfaces of the first and second leads. The reflecting member is preferably arranged so that at a portion in contact with the first light emitting element, the reflecting member is approximately in a same plane or at lower than the upper surface of the first light emitting element. The reflecting member is preferably arranged in contact with one or more lateral surfaces that define the recess. The reflecting member may be made of particles and preferably contains at least one light-diffusing material selected from a group consisting of zirconium oxide, yttrium oxide, aluminum oxide, aluminum hydride, barium carbonate, barium sulfide, magnesium oxide, and magnesium carbonate. The particles of the reflecting member may be secured, directly or via an adhesive material or the like, on the first lead and the second lead.

Sealing Member

The sealing member can be made of any appropriate material that is electrically insulating and allows the light emitted from the first light emitting element and the fluorescent material to pass through, and has fluidity before it is solidified or hardened. Examples of the sealing member include thermoplastic resin, thermosetting resin, and glass. More specific examples of the thermosetting resin include epoxy resin, silicone resin, and modified silicone resin such as epoxy-modified silicone resin. Among those, a silicone resin is preferable because of it has high heat-resistance and high light-resistance, and exhibits a small volume contraction in solidifying or hardening.

The sealing member preferably can disperse a fluorescent material. As long as the state of the dispersion is not adverse, presence of small amount of precipitation of the fluorescent material, or occurrence of concentration difference in the dispersed fluorescent material can be allowed. That is, uniform dispersion of the fluorescent material by using a sealing member having high viscosity is preferable, but instead, a sealing member having slightly lower viscosity may be employed to reduce the hardening time, while a portion of the fluorescent material is allowed to be precipitated but most of the fluorescent material is dispersed. At the time of mixing fluorescent material particles in the sealing member, if a sealing member having a high viscosity is used, a higher viscosity may result depending on the amount of the fluorescent material, which makes it difficult to obtain uniform dispersion of the fluorescent material particles. With the use of a sealing member having lower viscosity, a rise in the viscosity can be reduced, which allows dispersion of higher concentration of the fluorescent material particles.

At the time of uniformly dispersing the fluorescent material, other components such as a light diffusing material may also be included as needed.

The sealing member can be formed with a single layer, or with a plurality of layers, such as two layers or three layers. For example, the sealing member may include a first layer proximate to the first light emitting element and a second layer distal to the first light emitting element, further, an interface may be present between the first layer and the second layer. The first layer and the second layer may be made of the same material. The first layer and the second layer may be made of different materials. For example, providing a second layer that has a refractive index greater than that of the first layer allows to reflect light emitted from the first light emitting element at the interface between the first layer and the second layer, so that the light from the first light emitting element can be returned to the first layer side, which can increase the amount of light incident on the fluorescent material. Alternatively, providing a second layer that has a refractive index smaller than that of the first layer allows to efficiently transmit light emitted from the fluorescent material contained in the first layer to the second layer, so that the light extraction efficiency from the first light emitting device to the outside can be increased.

Fluorescent Material

The fluorescent material can absorb light emitted from the first light emitting element and emit light of different wavelength. The present embodiment employs at least one fluorescent material that can absorb light from the first light emitting element having a first peak emission wavelength in a range of 370 nm to 420 nm and emit light having a second peak emission wavelength in a range of 550 nm to 780 nm. That is, the fluorescent material emits a red light. The fluorescent material has a second peak emission wavelength in a range of 550 nm to 780 nm, and the emission spectrum covers a range of wavelengths from 550 nm to 780 nm. The first light emitting element preferably has a second peak emission wavelength in a range of 610 nm to 680 nm, more preferably in a range of 610 nm to 650 nm. Because the luminosity efficiency factor has a peak at 555 nm which decreases toward longer wavelength, and thus, a fluorescent material having a second peak wavelength in a range of 610 nm to 650 nm is preferable to improve the luminance.

It is preferable that one fluorescent material is contained in the sealing member, but two or three fluorescent materials may be contained. Because, the increase in the number of fluorescent materials requires consideration of deterioration, change in thermal characteristics, and so forth of each fluorescent material, which increases difficulty in controlling. Specific examples of the fluorescent materials include, SCASN-based fluorescent materials such as $(Sr,Ca)AlSiN_3$:Eu, CASN-based fluorescent materials such as $CaAlSiN_3$:Eu, CESN fluorescent materials such as $Ca_2Si_5N_8$:Eu, $(Sr,Ca)_2Si_5N_8$:Eu, and KSF-based fluorescent materials such as $K_2SiF_6$:Mn. Of those, at least one SCASN-based fluorescent material and at least one CASN-based fluorescent material, or a combination of a plurality of SCASN-based and CASN-based fluorescent materials are preferably used. Note that among the SCASN fluorescent materials, different ratio of Sr and Ca may result different emission color, so that fluorescent materials having a difference in the peak emission wavelengths 5 nm or greater are determined as different fluorescent materials.

In an emission spectrum of the first light emitting device, when a maximum intensity of the second peak emission wavelength is assumed to be 1, a relative intensity of the first peak emission wavelength is to be in a range of 0.005 to 0.2. The relative intensity can be adjusted by the type and the use amount of the fluorescent material.

The content mass % of the fluorescent material can be determined by measuring characteristic x-rays released when a cross section of the first light emitting device is irradiated by electron beams, using a scanning electron microscope. For example, the measurement may be performed by using a scanning electron microscope S-4700 manufactured by Hitachi, Ltd.

In the case in which the phosphor member includes one or more other components, the contents thereof can be suitably set according to purpose and the like. In view of light extraction efficiency, the average particle diameter of the fluorescent material is preferably in a range of 1 μm to 20 μm, more preferably in a range of 5 μm to 15 μm.

Light Diffusing Material and Other Components

A light diffusing material is preferably contained in the sealing member to obtain more uniform dispersion of the fluorescent material in the sealing member. For the light diffusing material, silica, alumina, magnesium oxide, antimony oxide, aluminum oxide, barium sulfate, magnesium oxide, barium carbonate, barium titanate, or the like can be used, among those, silica is preferably used. The particle diameter of silica may be in a range of 1 to 300 μm, preferably in a range of 1 to 50 μm. The refractive index of silica to be used is in a range of 1.46 to 1.53, and with the use of silicone resin having a refractive index in a range of 1.54 to 1.56 for the sealing member, the reflectance can be improved. The content of the light diffusing material may be in a range of 0.1 to 10 parts by weight, preferably in a range of 0.8 to 2 parts by weight, with respect to 100 parts by weight of the sealing member.

When needed, the sealing member may include one or more other components in addition to the fluorescent material and the light diffusing material. Examples of other components include a filler material, an optical stabilizer, a coloring agent, and an antioxidant. The filler material is used with the aim to increase the strength of the fixing part of the package, or the like, rather than aiming to reflect light. In the case where the sealing member includes one or more other components, the contents thereof can be suitably set according to purpose and the like. For example, in the case of including a filler material, the content of the filler material can be in a range of 0.01 to 20 parts by weight with respect to 100 parts by weight of the sealing resin.

Light Source

The first light emitting device can be applied in a light source that includes the first light emitting device, a second light emitting device (a first additional light emitting device) having a second light emitting element made of a nitride-based semiconductor and configured to emit green light, and a third light emitting device (a second additional light emitting device) having a third light emitting element made of a nitride-based semiconductor and configured to emit blue light. The light source is a so-called a three-in one light source, employing three primary colors of light, and is corresponding to a single pixel in a display image.

In the conventional light sources employing a red light emitting element made of GaP, GaAs, or the like, in combination of a green light emitting element and a blue light emitting element as described above, due to a difference in thermal characteristics between GaP, GaAs, or the like, and the nitride-based semiconductors, shifts in color have been occurred as the temperature changes. When the red light emitting element made of GaP, GaAs, or the like is used and the ambient temperature of the light emitting element is raised from 25° C., to 150° C., occurrence of a shift in color due to a shift in the peak emission wavelength of about 20 nm to 30 nm to a shorter wavelength side has been observed.

On the other hand, in a light source that includes the first light emitting device using the first light emitting element that is a nitride-based semiconductor, the second light emitting device (the first additional light emitting device) having the second light emitting element made of a nitride-based semiconductor and configured to emit green light, and a third light emitting device (the second additional light emitting device) having a third light emitting element made of a nitride-based semiconductor and configured to emit blue light, all the light emitting elements are made of nitride-based semiconductors and having common thermal characteristics. Thus, shifts in color may be very small even in occurrence of change in the temperature. In particular, when the first light emitting element that is a nitride-based semiconductor is used, and the ambient temperature of the light emitting element is raised from 25° C., to 150° C., a shift of the peak emission wavelength in the emission spectrum is merely 3 nm or less, and a significant shift in color has not been observed.

Occurrence of color shifts of a light source for direct-view applications such as display may be a significant obstacle. Therefore, the light source according to the present embodiment can be very advantageous in that color shifts of the light source can be substantially prevented.

EXAMPLES

Next, the present disclosure will be more specifically described with reference to examples, which however are not intended to limit the present invention.

Figure 4:
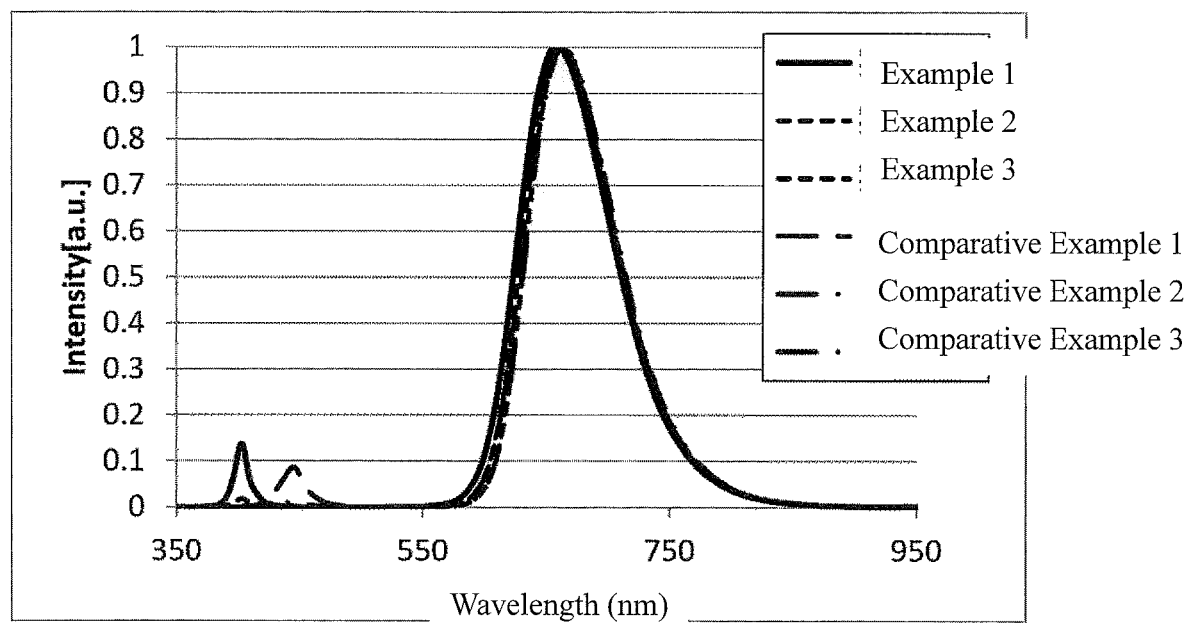
FIG. 4 is a diagram showing emission spectra of light emitting devices according to Examples 1 to 3 and Comparative Examples 1 to 3.
Figure 5:
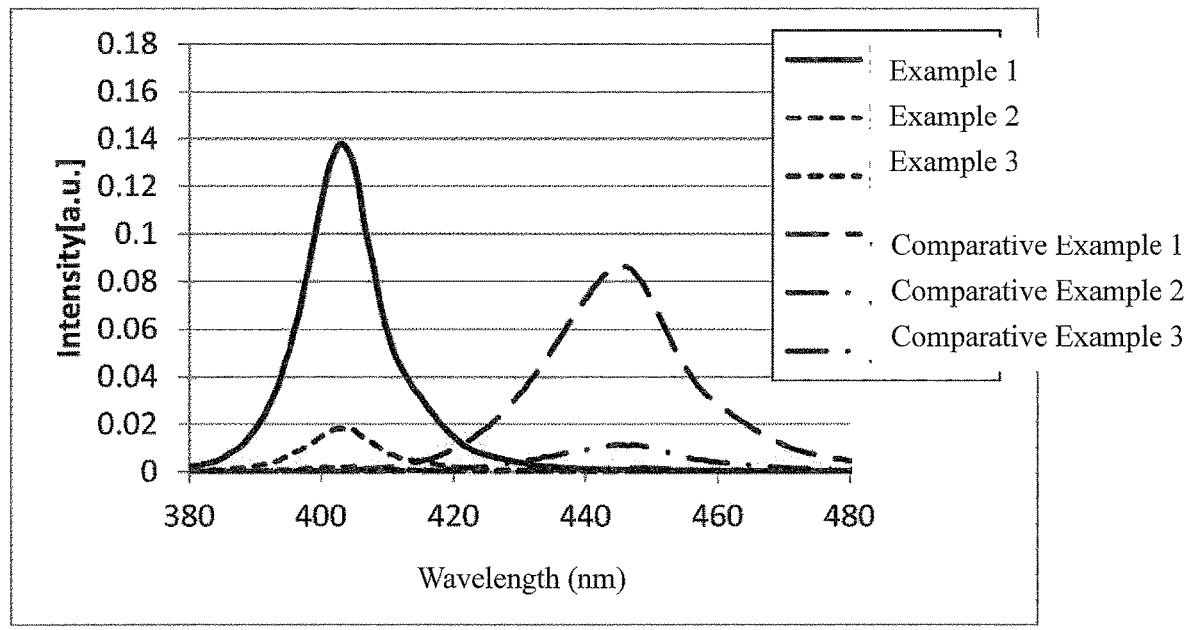
FIG. 5 is a diagram showing a part of emission spectra of light emitting devices according to Examples 1 to 3 and Comparative Examples 1 to 3.
Figure 6:
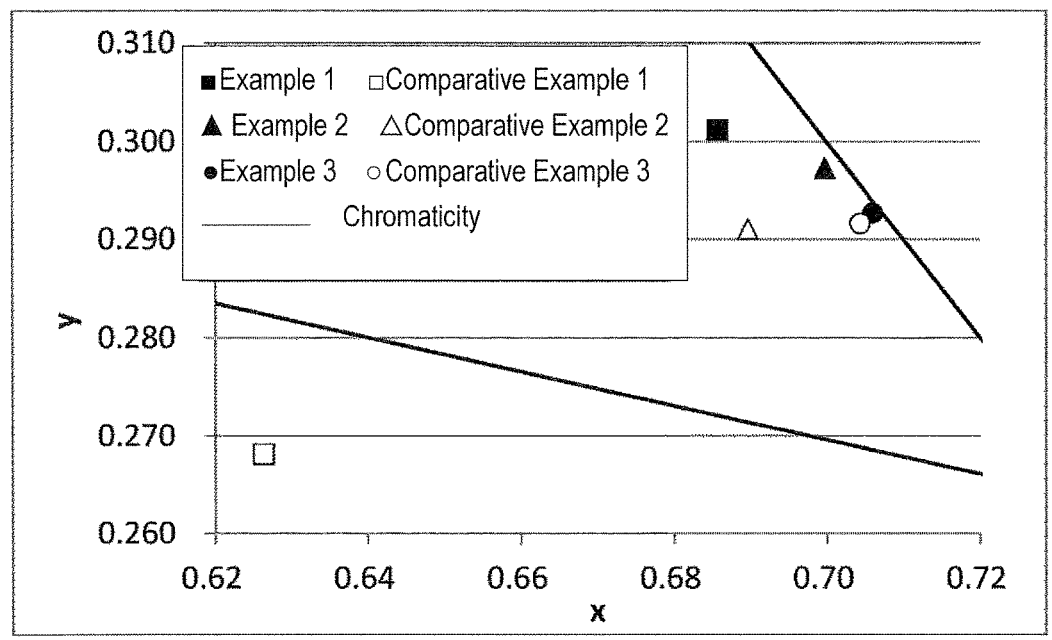
FIG. 6 is a diagram showing chromaticity coordinates of light emitted by light emitting devices according to Examples 1 to 3 and Comparative Examples 1 to 3.
Figure 7:
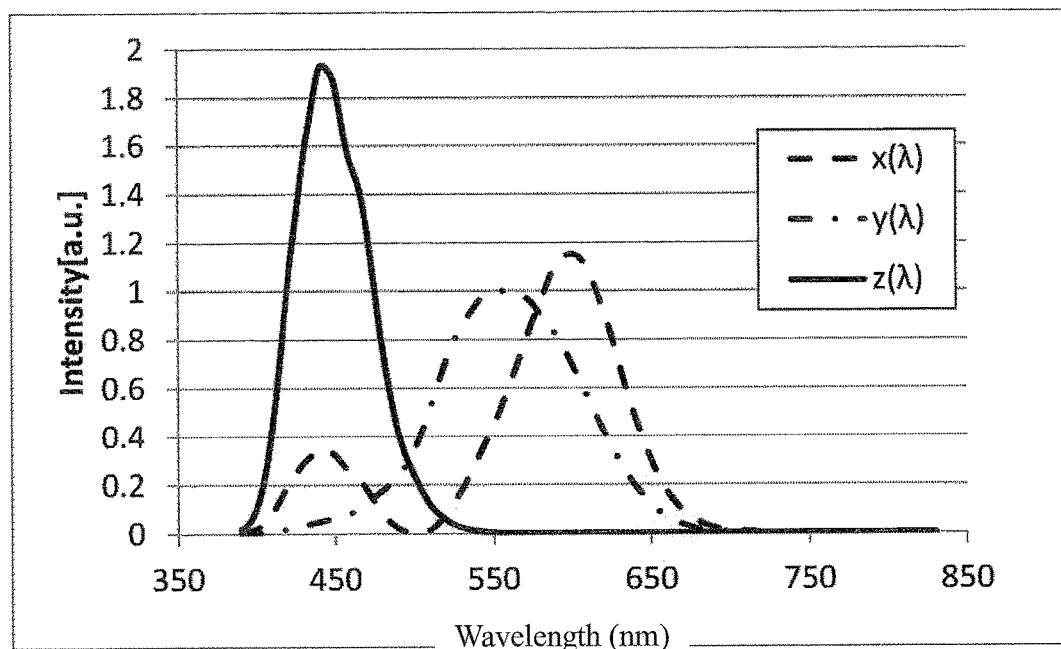
FIG. 7 is a diagram showing color matching function of a 2-degree visual field.

Next, the first light emitting devices of Examples 1 to 3 and Comparative Examples 1 to 3 will be described. FIG. 4 is a diagram showing emission spectra of light emitting devices according to Examples 1 to 3 and Comparative Examples 1 to 3. FIG. 5 is a diagram showing a part of emission spectra of light emitting devices according to Examples 1 to 3 and Comparative Examples 1 to 3. FIG. 6 is a diagram showing chromaticity coordinates of light emitted by light emitting devices according to Examples 1 to 3 and Comparative Examples 1 to 3; FIG. 7 is a diagram showing color matching function of a 2-degree visual field, which is specified by Japanese Industrial Standard (JIS) Z 8781-1 that refers to the CIE 1931 2-degree Standard Observer. For example, the term "2-degree visual field" is used in color determination, in which an observer looks at a sample with 1.7 cm diameter at a distance of 50 cm from a direction perpendicular to the diameter of the sample to determine a color of the sample.

Examples 1-3, Comparative Examples 1-3

Table 1 shows powder properties and luminous characteristics of the fluorescent materials A, B, and C. As the luminous characteristics of the fluorescent materials A to C, the chromaticity coordinates x and y of fluorescent light emitted by an excitation light of 460 nm are shown. The average particle size of each of the fluorescent materials is listed as a Fisher number measured by using a Fisher Sub-Sieve Sizer (manufactured by Thermo Fisher Scientific Co.) that employs an air permeable method. The median particle size Dm is a volume median particle size measured by using a Coulter Multisizer II (manufactured by Beckman Coulter Inc.) that determines the electric resistance of particles.

TABLE 1

| | Composition Formula | Average Particle Diameter (μm) | Dm (μm) | 460 nm-Excitation Light Emission Properties | |
|---|---|---|---|---|---|
| | | | | x | y |
| Fluorescent Material A | $CaAlSiN_3:Eu$ | 13.0 | 18.0 | 0.682 | 0.317 |
| Fluorescent Material B | $CaAlSiN_3:Eu$ | 13.0 | 18.0 | 0.690 | 0.310 |
| Fluorescent Material C | $CaAlSiN_3:Eu$ | 12.0 | 16.5 | 0.655 | 0.344 |

The first light emitting devices are produced according to Examples 1 to 3 and Comparative Examples 1 to 3, respectively. In the below, similar to those in the first embodiment may be appropriately omitted.

For the first light emitting element to be used in the first light emitting devices of Examples 1 to 3, a nitride-based semiconductor light emitting element with a first peak emission wavelength at about 405 nm is used. For the first light emitting element to be used in the first light emitting devices of Comparative Examples 1 to 3, a nitride-based semiconductor light emitting element with a first peak emission wavelength $\lambda p$ at about 450 nm is used. For the fluorescent materials A and B to be used in the first light emitting devices of Examples 1 to 3 and Comparative Examples 1 to 3, fluorescent materials respectively with a second peak emission wavelength in a range of 610 nm to 750 nm are used. For the packages used in the first light emitting devices of Examples 1 to 3 and Comparative Examples 1 to 3, NJSW172A manufactured by Nichia Corporation are used, and for the sealing member, silicone resin (KJR-9023NW, manufactured by Shin-Etsu Chemical Co., Ltd) is used.

The fluorescent materials A and B are used such that the main wavelengths of the light emitted from the first light emitting devices are respectively in a range of about 620 nm to about 640 nm, respectively. In Examples 1 to 3 and Comparative Examples 1 to 3, the fluorescent materials A and B are used in a mixture. In the present specification, the term "main wavelength" refers to a wavelength at a point obtained by connecting a chromaticity point of a white light and the chromaticity point of light emitted by each of the first light emitting devices by a straight line, and determining the point of intersection of an extension line of the straight line and the locus of a monochromatic light.

The fluorescent materials A and B described above are contained in the sealing member at predetermined ratios, and mixed and dispersed, and further degassed, to obtain respective fluorescent material-containing resin compounds. The percentage contents of the fluorescent materials shown in the tables are respectively weight percentages based on the weight of the sealing member as 100%.

Next, the fluorescent material-containing resin composition is injected to enclose the first light emitting element, and heat treating is applied at about 150° C., for four hours to harden the resin composition. Through the steps as described above, each of the first light emitting devices is produced. In the first light emitting devices of Examples 1 to 3 and Comparative Examples 1 to 3, a light reflective material and a diffusing material are not added.

Table 2 shows luminous characteristics of the first light emitting devices of Examples 1 to 3 and Comparative Examples 1 to 3.

TABLE 2

| | Wavelength of Light Emitting Element | Fluorescent Material | Fluorescent Material/Resin (%) | Chromaticity Coordinates | | Wavelength (nm) | Color Purity (%) |
|---|---|---|---|---|---|---|---|
| | | | | x | y | | |
| Example 1 | 405 nm | Fluorescent Material A, B | 30 | 0.686 | 0.301 | 624.6 | 96.1 |
| Example 2 | 405 nm | Fluorescent Material A, B | 45 | 0.700 | 0.297 | 626.5 | 99.1 |
| Example 3 | 405 nm | Fluorescent Material A, B | 60 | 0.706 | 0.293 | 629.6 | 99.6 |
| Comparative Example 1 | 450 nm | Fluorescent Material A, B | 30 | 0.626 | 0.268 | 494.5 | 78.2 |
| Comparative Example 2 | 450 nm | Fluorescent Material A, B | 45 | 0.690 | 0.291 | 632.9 | 94.2 |
| Comparative Example 3 | 450 nm | Fluorescent Material A, B | 60 | 0.704 | 0.292 | 630.7 | 98.8 |

The first light emitting devices of Examples 1 to 3 and Comparative Examples 2 and 3 each emits predetermined red light. The light emitted from the first light emitting device of Comparative Example 1 is not in the predetermined chromaticity range and has a main wavelength $\lambda d$ shorter than that of Example 1. With the use of the same fluorescent material at a substantially the same content amount, the light emitting device 1 of Example 1 exhibits higher color purity compare to that of Comparative Example 1. With the use of the same fluorescent material at a substantially the same content amount, the light emitting device 1 of Example 2 exhibits higher color purity compare to that of Comparative Example 2. With the use of the same fluorescent material at a substantially the same content amount, the light emitting device 1 of Example 3 exhibits higher color purity compare to that of Comparative Example 3. Compared to Comparative Examples 1 to 3, Examples 1 and 3 require a smaller rate of fluorescent material configured to obtain red light of the predetermined color and high color purity, which indicates a smaller cost in manufacturing the first light emitting devices. In the present specification, the term "color purity" is obtained by dividing a distance between a chromaticity point of a white light and the chromaticity point of light emitted by the first light emitting device by a length of a straight line segment between the chromaticity point of a white light and the locus of a monochromatic light, through the chromaticity point of light emitted from the first light emitting device. The reduction in the content amounts of the fluorescent material in Examples 1 to 3 is due to that the wavelength of the light emitted from the light emitting element is not available in the color matching function as shown in FIG. 7 and thus even the light from the light emitting element is extracted to the outside, the light is not perceived as color to the human eye. The color matching function is the numerical description of the spectral response sensitivity of the human eye and defined as function of wavelength, which is represented by three functions of XYZ color system.

Example 4, Comparative Example 4

Figure 8:
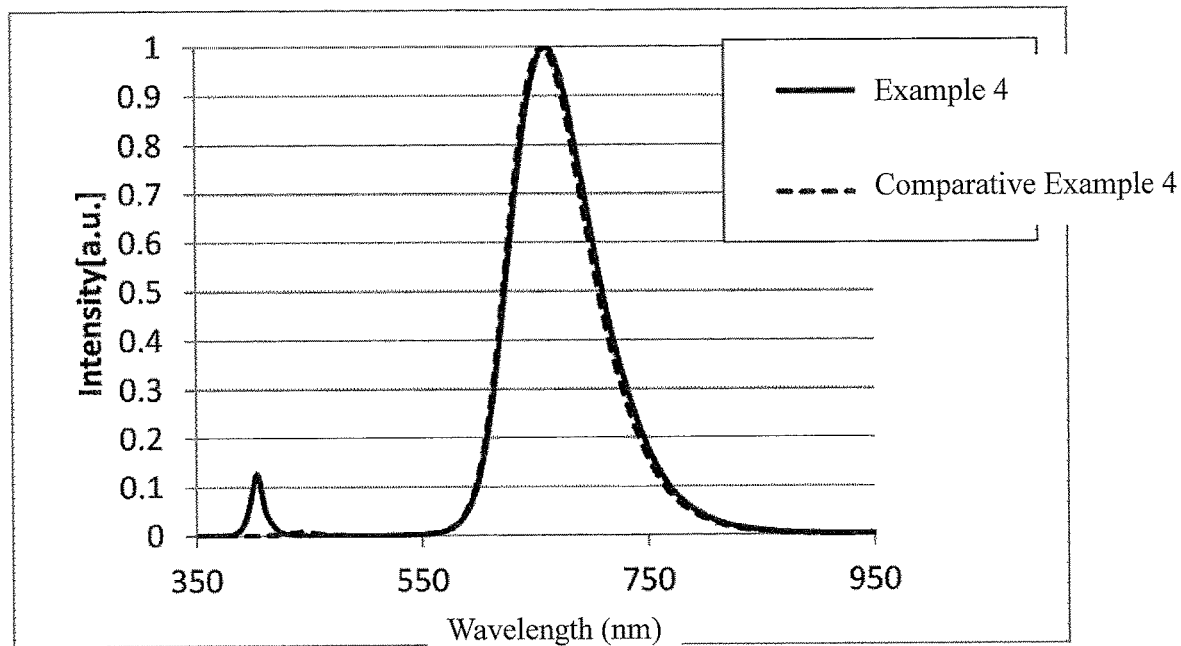
FIG. 8 is a diagram showing emission spectra of light emitting devices according to Example 4 and Comparative Example 4.
Figure 9:
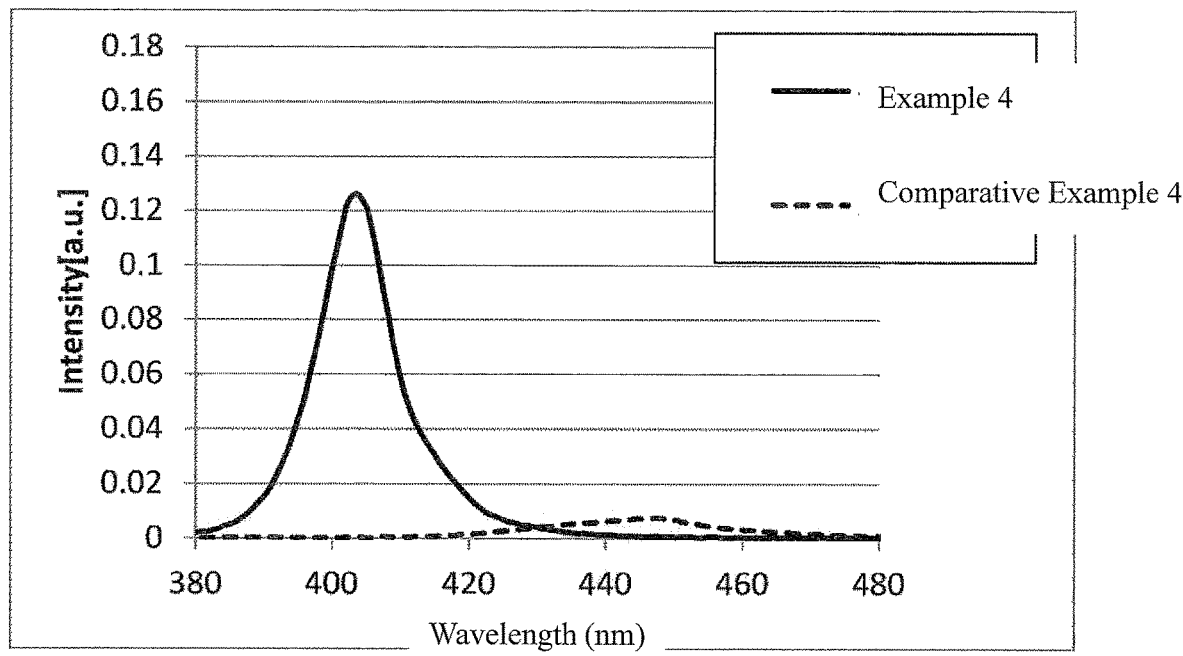
FIG. 9 is a diagram showing a part of emission spectra of light emitting devices according to Example 4 and Comparative Example 4.
Figure 10:
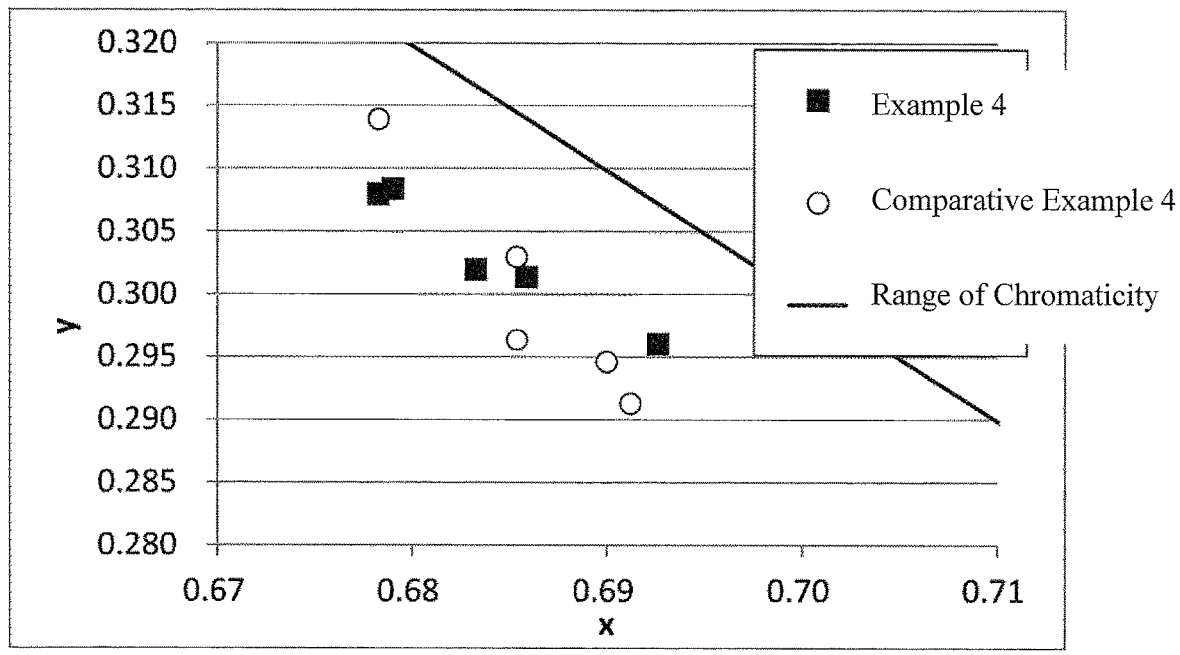
FIG. 10 is a diagram showing chromaticity coordinates of light emitted by light emitting devices according to the Example 4 and Comparative Example 4.

Next, the first light emitting devices of Examples 4 and Comparative Example 4 will be described. FIG. 8 is a diagram showing emission spectra of light emitting devices according to Example 4 and Comparative Example 4. FIG. 9 is a diagram showing a part of emission spectra of light emitting devices according to Example 4 and Comparative Example 4. FIG. 10 is a diagram showing chromaticity coordinates of light emitted by light emitting devices according to the Example 4 and Comparative Example 4.

In Example 4 and Comparative Example 4, packages NJSW172A, manufactured by Nichia Corporation are used. For the first light emitting element, a light emitting element with a first peak emission wavelength at about 405 nm is used in Example 4, and a light emitting element with a first peak emission wavelength $\lambda p$ at about 450 nm is used in Comparative Example 4. For the sealing member, silicone resin (KJR-9023, manufactured by Shin-Etsu Chemical Co., Ltd.), is used. The fluorescent materials A, B, and C are used such that the main wavelengths of the light emitted from the first light emitting devices are respectively in a range of about 615 nm to about 640 nm, respectively. In Example 4 and Comparative Example 4, the fluorescent materials A, B, and C are used in a mixture, respectively. The fluorescent materials A, B and C described above are contained in the sealing member at predetermined ratios, and mixed and dispersed, and further degassed, to obtain respective fluorescent material-containing resin compounds. The percentage contents of the fluorescent materials shown in the tables are respectively weight percentages based on the weight of the sealing member as 100%.

Next, the fluorescent material-containing resin composition is injected to enclose the first light emitting element, and heat treating is applied at about 150° C., for four hours to harden the resin composition. Through the steps as described above, each of the first light emitting devices is produced. In the first light emitting devices of Example 4 and Comparative Example 4, a light reflecting material and a light diffusing material are not added.

Table 3 shows luminous characteristics of the first light emitting devices of Example 4 and Comparative Example 4.

TABLE 3

| | Wavelength of Light Emitting Element | Fluorescent Material | Fluorescent Material/Resin (%) | Luminous Efficiency (lm/W) | Chromaticity Coordinates | |
|---|---|---|---|---|---|---|
| | | | | | x | y |
| Example 4 | 405 nm | Fluorescent Material A, B | 26.8-30 | 7.9 | 0.685 | 0.301 |
| Comparative Example 4 | 450 nm | Fluorescent Material A, B, C | 50-75 | 7.5 | 0.685 | 0.301 |

The first light emitting devices of Example 4 and Comparative Example 4 emit predetermined red light, respectively. In order to obtain substantially the same chromaticity point, Example 4 requires a smaller amount of the fluorescent material compared to that of Comparative Example 4, the first light emitting device can be manufactured with a smaller cost. Also, at the same chromaticity point, compared to Comparative Example 4, Example 4 exhibits a higher luminous efficiency of 0.4 (lm/W) and greater brightness. Compared to Comparative Example 4, Example 4 requires a smaller amount of the fluorescent material, can efficiently irradiate the fluorescent material with light from the first light emitting element, and can efficiently extract light from the fluorescent material to the outside without being interrupted by other particles of the fluorescent material, and thus, a high luminous efficiency can be obtained.

The first light emitting devices according to the embodiments of the present invention can be applied in wide range of fields such as general lighting, on-vehicle lighting, decorative lighting, warning lamps, and indicators.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

Obviously, numerous modifications and variations of the present invention are possible in light of the above teachings. It is therefore to be understood that within the scope of the appended claims, the invention may be practiced otherwise than as specifically described herein.

What is claimed is:

1. A light emitting device comprising:
   at least one first light emitting element to emit a first light having a first peak emission wavelength in a range of 370 nm or greater and 420 nm or less; and
   at least one fluorescent material to convert the first light to a second light having a second peak emission wavelength in a range of 550 nm or greater and 780 nm or less, the second light having chromaticity existing in an enclosed area in a CIE 1931 chromaticity diagram in which chromaticity is defined in x and y coordinates, the CIE 1931 chromaticity diagram having a curved boundary indicating a spectral locus, the enclosed area being enclosed with a first straight line, a second straight line, a third straight line, and a curved line, the first straight line connecting a first point which x is equal to 0.666 and y is equal to 0.334 and a second point at which x is equal to 0.643 and y is equal to 0.334, the second straight line connecting the second point and a third point at which x is equal to 0.576 and y is equal to 0.291, the third straight line connecting the third point and a fourth point at which x is equal to 0.737 and y is equal to 0.263, the curved line connecting the fourth point and the first point, the curved line being a part of the curved boundary.

2. The light emitting device according to claim 1, wherein in an emission spectrum of the light emitting device, a ratio of an intensity of the first peak emission wavelength to a maximum intensity of the second peak emission wavelength is in a range of 0.005 to 0.20.

3. The light emitting device according to claim 1, wherein the at least one fluorescent material includes at least one selected from the group consisting of a (Sr, Ca)AlSiN3:Eu fluorescent material, a CaAlSiN3:Eu fluorescent material, and a K2SiF6:Mn fluorescent material.

4. The light emitting device according to claim 1, wherein the at least one fluorescent material includes a combination of the (Sr, Ca)AlSiN3:Eu fluorescent material and the CaAlSiN3:Eu fluorescent material.

5. The light emitting device according to claim 1 further comprising:
   a light-reflecting member covering lateral surfaces of the first light emitting element, and
   a sealing member covering an upper surface of the first light emitting element and containing the at least one fluorescent material.

6. The light emitting device according to claim 5, wherein the sealing member includes a first layer containing the CaAlSiN3:Eu fluorescent material and a second layer containing the (Sr, Ca)AlSiN3:Eu fluorescent material, the first light emitting element being closer to the first layer than to the second layer.

7. The light emitting device according to claim 5, wherein the sealing member includes a first layer containing the fluorescent material a second layer containing the fluorescent material, and an interface interposed between the first layer and the second layer, the first light emitting element being closer to the first layer than to the second layer, and a ratio of a first content of the fluorescent material in the second layer to a second content of the fluorescent material in the first layer is in a range of 1% to 60%.

8. The light emitting device according to claim 5, wherein the content of the fluorescent material in the sealing member is in a range of 20 to 50 parts by weight with respect to 100 parts by weight of the sealing member 50.

9. The light emitting device according to claim 1, wherein the first light emitting element is made of a nitride-based semiconductor.

10. The light emitting device according to claim 1 further comprising a dielectric multilayer film on the sealing member.

11. The light emitting device according to claim 10, wherein the dielectric multilayer film has a reflectance of 40% or greater of a light having a wavelength ranging from 370 nm to 420 nm, the light being incident on the dielectric multilayer film at an incident angle range of 0° to 85°.

12. The light emitting device according to claim 10, wherein the dielectric multilayer film has a reflectance of 90% or greater of a light having a wavelength ranging from 370 nm to 420 nm, the light being incident on the dielectric multilayer film at an incident angle range of 0° to 50°.

13. The light emitting device according to claim 1, wherein both an x-difference and a y-difference in chromaticity coordinates between the second light at an ambient temperature of 25° C. and the second light at an ambient temperature of 150° C. are within a range of 0.010.

14. A light source comprising:
    the light emitting device according to claim 1;
    a first additional light emitting device having a second light emitting element made of a nitride semiconductor to emit green light; and
    a second additional light emitting device having a third light emitting element made of a nitride semiconductor to emit blue light.

* * * * *